: US008107801B2

(12) United States Patent
Shimizu et al.

(10) Patent No.: US 8,107,801 B2
(45) Date of Patent: Jan. 31, 2012

(54) HEAT TREATMENT APPARATUS, COMPUTER PROGRAM, AND STORAGE MEDIUM

(75) Inventors: Masahiro Shimizu, Nirasaki (JP); Shigeru Kasai, Nirasaki (JP); Masatake Yoneda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 930 days.

(21) Appl. No.: 12/053,336

(22) Filed: Mar. 21, 2008

(65) Prior Publication Data
US 2008/0187299 A1 Aug. 7, 2008

Related U.S. Application Data

(63) Continuation of application No. PCT/JP2006/318031, filed on Sep. 12, 2006.

(30) Foreign Application Priority Data

Sep. 21, 2005 (JP) .................................. 2005-273907
Dec. 5, 2005 (JP) .................................. 2005-351220

(51) Int. Cl.
*F26B 19/00* (2006.01)
(52) U.S. Cl. ....................................... 392/418; 392/407
(58) Field of Classification Search .................. 392/407, 392/416, 418
See application file for complete search history.

(56) References Cited

U.S. PATENT DOCUMENTS

| 4,435,092 | A * | 3/1984 | Iuchi ............................. 374/129 |
| 5,689,614 | A | 11/1997 | Gronet et al. |
| 6,376,804 | B1 * | 4/2002 | Ranish et al. ................. 219/390 |
| 6,402,509 | B1 * | 6/2002 | Ookura et al. ................ 432/253 |
| 6,633,022 | B2 * | 10/2003 | Kitano et al. ................. 219/390 |
| 6,818,864 | B2 * | 11/2004 | Ptak .............................. 219/390 |
| 6,842,582 | B2 * | 1/2005 | Morimoto et al. ............ 392/416 |
| 7,009,148 | B2 | 3/2006 | Kawano et al. |
| 7,294,586 | B2 | 11/2007 | Kawano et al. |
| 7,347,589 | B2 | 3/2008 | Ge |
| 2004/0026400 | A1 | 2/2004 | Ptak |
| 2005/0077280 | A1 | 4/2005 | Ptak |
| 2006/0213616 | A1 * | 9/2006 | Ogasawara ............... 156/345.24 |
| 2008/0064226 | A1 | 3/2008 | Kawano et al. |
| 2008/0226272 | A1 * | 9/2008 | Kasai et al. ................... 392/418 |

FOREIGN PATENT DOCUMENTS

| JP | 2001-44554 A | 2/2001 |
| JP | 2001-85408 | 3/2001 |
| JP | 4-207020 A | 7/2002 |
| JP | 2003-77857 A | 3/2003 |
| JP | 2004-134674 | 4/2004 |
| JP | 2004-296245 | 10/2004 |
| JP | 2005-101237 A | 4/2005 |
| KR | 10-2004-0093686 | 11/2004 |
| WO | WO 2004/015348 A1 | 2/2004 |

* cited by examiner

*Primary Examiner* — Thor Campbell
(74) *Attorney, Agent, or Firm* — Oblon, Spivak, McClelland, Maier & Neustadt, L.L.P.

(57) ABSTRACT

A heat treatment apparatus for performing prescribed heat treatment to a subject (W) to be treated is provided with a processing chamber in which air can be exhausted; a mounting table arranged in the processing chamber, for placing on an upper plane the subject to be treated; a plurality of thermoelectric conversion elements arranged on an upper part of the mounting table; a light transmitting window for covering a ceiling portion of the processing chamber airtight; and a gas introduction unit for introducing a required gas into the processing chamber. A heating unit which includes a plurality of heating light sources including a semiconductor light emitting element for emitting heating light to the subject to be treated, is provided above the light transmitting window. Thus, heating efficiency is improved and temperature can be increased and reduced at a higher speed for the subject to be treated.

27 Claims, 8 Drawing Sheets

HEAT TREATMENT APPARATUS, COMPUTER PROGRAM, AND STORAGE MEDIUM

This application is a Continuation Application of PCT International Application No. PCT/JP2006/318031 filed on Sep. 12, 2006, which designated the United States.

FIELD OF THE INVENTION

The present invention relates to a single-wafer heat treatment apparatus, a computer program and a storage medium for performing a specified heat treatment on a semiconductor wafer or the like by irradiating light for heating thereto.

BACKGROUND OF THE INVENTION

Generally, in order to fabricate a desired semiconductor device, various heat treatment processes such as a film forming process, a pattern etching process, an oxidation/diffusion process, a quality modification process, an annealing process and the like are repeatedly performed on a semiconductor device. With a recent trend towards a high-density, a multi-layered structure and high-integration of the semiconductor device, means employed therefor has been getting more tightly restricted, and especially, an improvement of in-surface uniformity and film quality of the wafer has been demanded in such various heat treatment processes. For example, in case of processing a channel of a semiconductor device, e.g., a transistor, after ion-implantation of impurity atoms into the channel, an annealing process is generally carried out to stabilize the atomic structure.

In this case, if the annealing process is performed for a long period of time, the atomic structure can be stabilized, but at the same time, this allows for the impurity atoms to diffuse deeply in a film thickness direction to penetrate throughout the channel. Thus, to suppress the diffusion of the impurities, it needs to be performed in the shortest possible time. That is, in order to stabilize the atomic structure with the channel having a thin thickness without having the impurity atoms to penetrate throughout, it is necessary to rapidly raise the temperature of the semiconductor wafer to a high temperature, and further, after completing the annealing process, to rapidly lower it to a low temperature where diffusion does not occur.

For this annealing process, lamp annealing using a heating lamp is generally carried out in the conventional processing apparatus (see, U.S. Pat. No. 5,689,614).

Further, another conventional processing apparatus wherein a wafer stage is provided with a peltier element used to raise or lower a temperature of a wafer in the etching process performed in the range between 100° C. and 250° C. is disclosed, for example, in Japanese Patent Laid-open Application No. 2001-85408.

Recently, a semiconductor light emitting element such as an LED device, a laser device or the like with a relatively large output tends to be popularly used as a heating source or a light source (see, Japanese Patent Laid-open Application No. 2004-296245, Japanese Patent Laid-open Application No. 2004-134674, and U.S. Pat. No. 6,818,864). The LED or laser device is widely used because loss due to heat generation of the device itself is much smaller than that of the heating lamp, and the lifetime thereof is considerably longer than that of the heating lamp.

For example, Japanese Patent Laid-open Application No. 2004-296245 discloses a lamp formed by combining a heat pipe with an LED device, and Japanese Patent Laid-open Application No. 2004-134674 discloses that a resist is heated by using an LED or laser device, while U.S. Pat. No. 6,818,864 discloses an LED array used to perform a CVD process.

However, in case of performing a heat treatment as described above, in-surface temperature uniformity of the wafer has to be maintained. Particularly, in case of the oxidation/diffusion process, a temperature of the wafer needs to be rapidly raised or lowered in a short time to prevent excessive diffusion of the implanted impurities.

Further, in the conventional apparatus described above, for example, in the case of using the LED device, it is possible to rapidly raise the temperature of the wafer in the same manner as in the lamp heating. Further, since the device itself is not so heated, contrary to the lamp heating, the temperature of the wafer can be lowered at a relatively high speed.

However, as a design rule of a line width, a film thickness or the like becomes strict, the temperature of the wafer is required to be controlled at a high speed, but it is not possible to rapidly lower the temperature by using the above-mentioned conventional apparatus, which cannot cope with the new design rule.

SUMMARY OF THE INVENTION

The present invention has been conceived to effectively solve the problems described above. It is, therefore, an object of the present invention to provide a heat treatment apparatus, a computer program and a storage medium capable of raising or lowering a temperature at a higher speed with high heating efficiency.

In accordance with one aspect of the invention, there is provided a heat treatment apparatus for performing a specified heat treatment on a target object, including: an evacuable processing chamber; a mounting table on which the target object is mounted, the mounting table being disposed in the processing chamber; a plurality of thermoelectric conversion elements disposed in an upper portion of the mounting table; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element.

By preparing such plurality of thermoelectric conversion elements and the semiconductor light emitting element thereon, in case of heating the target object, an electric current is made to flow through the thermoelectric conversion elements in a direction to heat the target object and the light emitting element is turned on to emit heating light to thereby heat the target object, and, in case of cooling the target object, the electric current is made to flow through the thermoelectric conversion elements in a direction to cool the target object and the light emitting element is turned off. Therefore, higher heating efficiency and more rapid heat increase and decrease than the lamp heating can be realized.

In the heat treatment apparatus, first reflectors are being disposed in the vicinity of the respective heating sources, the first reflectors serving to reflect light from the respective heating sources to the target object.

In the heat treatment apparatus, the light reflected by each of the first reflector is focused on corresponding area of the target object.

In the heat treatment apparatus, a reflective surface of the first reflector is of a curved shape.

In the heat treatment apparatus, each of the heating sources includes an element attachment rod having a heat pipe, and each of the semiconductor light emitting elements is attached to an end portion of the corresponding element attachment rod.

In the heat treatment apparatus, the heating unit includes an element attachment housing to cover a top portion of the light transmitting window, and a base portion of each of the element attachment rod is supported by the element attachment housing.

In the heat treatment apparatus, the element attachment housing is of a dome shape, and its inner surface has a curved reflective surface serving as a second reflector.

In the heat treatment apparatus, the element attachment housing is provided with an element cooling unit for cooling the base portion of the element attachment rods.

In the heat treatment apparatus, each of the element attachment rods is extended in a vertical or near vertical direction.

In the heat treatment apparatus, the apparatus further includes a radiation thermometer for measuring a temperature of the target object, wherein a measurement wavelength band of the radiation thermometer is set different from that of the light emitted from the semiconductor light emitting elements.

In the heat treatment apparatus, the semiconductor light emitting elements are formed of an LED or semiconductor laser device.

In the heat treatment apparatus, the heating unit includes an element attachment housing to cover a top portion of the light transmitting window, and a lower surface of the element attachment housing is a flat element attachment surface facing the mounting table, the semiconductor light emitting elements of the heating sources are provided at the element attachment surface.

In the heat treatment apparatus, an area of the element attachment surface where the semiconductor light emitting elements are disposed is formed larger than a projected area of the target object mounted on the mounting table.

In the heat treatment apparatus, a specified number of the semiconductor light emitting elements are attached to a single small element installation substrate, and the single element installation substrate and the semiconductor light emitting elements attached thereto form a block module.

In the heat treatment apparatus, each element installation substrates is made of high thermoconductive material and has a cross section of a recess shape.

In the heat treatment apparatus, the semiconductor light emitting elements attached to the element installation substrate of each module are electrically connected in series.

In the heat treatment apparatus, either one or both of the element attachment surface of the element attachment housing and a surface of the element installation substrate are reflective surfaces functioning as reflectors, respectively.

In the heat treatment apparatus, each of the semiconductor light emitting elements includes an LED or semiconductor laser device.

In the heat treatment apparatus, each of the semiconductor light emitting elements includes an LED or semiconductor laser chip.

In the heat treatment apparatus, each of the semiconductor light emitting elements is a surface-emitting type device.

In the heat treatment apparatus, the semiconductor light emitting elements are partitioned into a plurality of zones, each of which is independently controlled.

In the heat treatment apparatus, a heat transfer medium path is formed in the vicinity of the thermoelectric conversion elements for flowing a heat transfer medium therethrough when necessary.

In the heat treatment apparatus, the apparatus further includes a control unit for controlling an operation of the entire heat treatment apparatus, wherein, in case of heating the target object, the control unit turns the heating unit on and allows an electric current to flow to the thermoelectric conversion elements through a thermoelectric conversion element control unit to heat the target object, and, in case of cooling the target object, the control unit turns the heating unit off and allows an electric current to flow to the thermoelectric conversion elements through the thermoelectric conversion element control unit to cool the target object.

In accordance with another aspect of the invention, there is provided a heat treatment apparatus for performing a specified heat treatment on a target object, including: an evacuable processing chamber; a mounting table on which the target object is mounted, the mounting table being disposed in the processing chamber; a lower heating unit for heating the target object, the lower heating unit being disposed at a lower portion of the mounting table; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element.

In the heat treatment apparatus, the lower heating unit includes a resistance heater or a heating lamp.

In the heat treatment apparatus, the apparatus further includes a control unit for controlling an operation of the entire heat treatment apparatus, wherein, in case of heating the target object, the control unit turns the lower heating unit on to heat the target object to a predetermined preliminary heating temperature and then turns the heating unit on to raise the temperature of the target object to a predetermined processing temperature.

In accordance with another aspect of the invention, there is provided a computer program for controlling a heat treatment apparatus which performs a specified heat treatment on a target object, the heat treatment apparatus including an evacuable processing chamber; a mounting table on which the target object is mounted, the mounting table being disposed in the processing chamber; a plurality of thermoelectric conversion elements disposed in an upper portion of the mounting table; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element, wherein, in case of heating the target object, the heating unit is turned on and an electric current is made to flow to the thermoelectric conversion elements to heat the target object, and, in case of cooling the target object, the heating unit is turned off and an electric current is made to flow to the thermoelectric conversion elements to cool the target object.

In accordance with another aspect of the invention, there is provided a computer program for controlling a heat treatment apparatus which performs a specified heat treatment on a target object, the heat treatment apparatus including an evacuable processing chamber; a mounting table on which the target object is mounted, the mounting table being disposed in the processing chamber; a lower heating unit for heating the target object, the lower heating unit being disposed at a lower portion of the mounting table; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element, wherein, in case of heating the target object, the lower heating unit is turned on to heat the target object to a predetermined preliminary heating temperature and then the heating unit is turned on to raise the temperature of the target object to a predetermined processing temperature.

In accordance with another aspect of the invention, there is provided a storage medium storing therein a computer program for controlling a heat treatment apparatus which performs a specified heat treatment on a target object, the heat treatment apparatus including an evacuable processing chamber; a mounting table on which the target object is mounted, the mounting table being disposed in the processing chamber; a plurality of thermoelectric conversion elements disposed in an upper portion of the mounting table; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element, wherein, in case of heating the target object, the heating unit is turned on and an electric current is made to flow to the thermoelectric conversion elements to heat the target object, and, in case of cooling the target object, the heating unit is turned off and an electric current is made to flow to the thermoelectric conversion elements to cool the target object.

In accordance with still another aspect of the invention, there is provided a storage medium storing therein a computer program for controlling a heat treatment apparatus which performs a specified heat treatment on a target object, the heat treatment apparatus including an evacuable processing chamber; a mounting table on which the target object is mounted, the mounting table being disposed in the processing chamber; a lower heating unit disposed in the mounting table or below the mounting table to heat the target object; a light transmitting window for airtightly covering a ceiling portion of the processing chamber; a gas introduction unit for introducing a required gas into the processing chamber; and a heating unit for emitting light for heating to the target object through the light transmitting window, the heating unit being disposed above the light transmitting window and having a plurality of heating sources each of which includes a semiconductor light emitting element, wherein, in case of heating the target object, the lower unit is turned on to preliminarily heat the target object until to reach at a predetermined temperature and then the heating unit is turned to heat the target object until to reach at a predetermined temperature.

The heat treatment apparatus and the storage medium in accordance with the present invention provide following excellent operational effects.

By forming the plurality of thermoelectric conversion elements at the mounting table and disposing the semiconductor light emitting elements above it, in case of heating the target object, a current flows to the thermoelectric conversion elements in such a direction so as to heat the target object and the semiconductor light emitting elements are turned on, whereby light for heating is emitted to heat the target object.

On the contrary, in case of cooling the target object, the current flows to the thermoelectric conversion elements in such a direction so as to cool the target object and the semiconductor light emitting elements are turned off. Therefore, heating efficiency is more improved than lamp heating and it is possible to realize higher-speed temperature elevation and reduction.

In accordance with the present invention, since the reflected light by each first reflector is focused on an individual area of the target object, the distribution of illumination intensity on the surface of the target object can be uniform, thereby making it possible to improve the in-surface temperature uniformity.

Further, in accordance with the present invention, since the measurement wavelength band of the radiation thermometer is set different from that of the light emitted from the semiconductor light emitting elements, stray light for the radiation thermometer is removed, thus making it possible to accurately measure the temperature by using the radiation thermometer.

DETAILED DESCRIPTION OF THE PREFERRED EMBODIMENTS

Hereinafter, a heat treatment apparatus and a storage medium in accordance with a first preferred embodiment of the present invention will be described in detail with reference to the accompanying drawings.

First Preferred Embodiment

Figure 1:
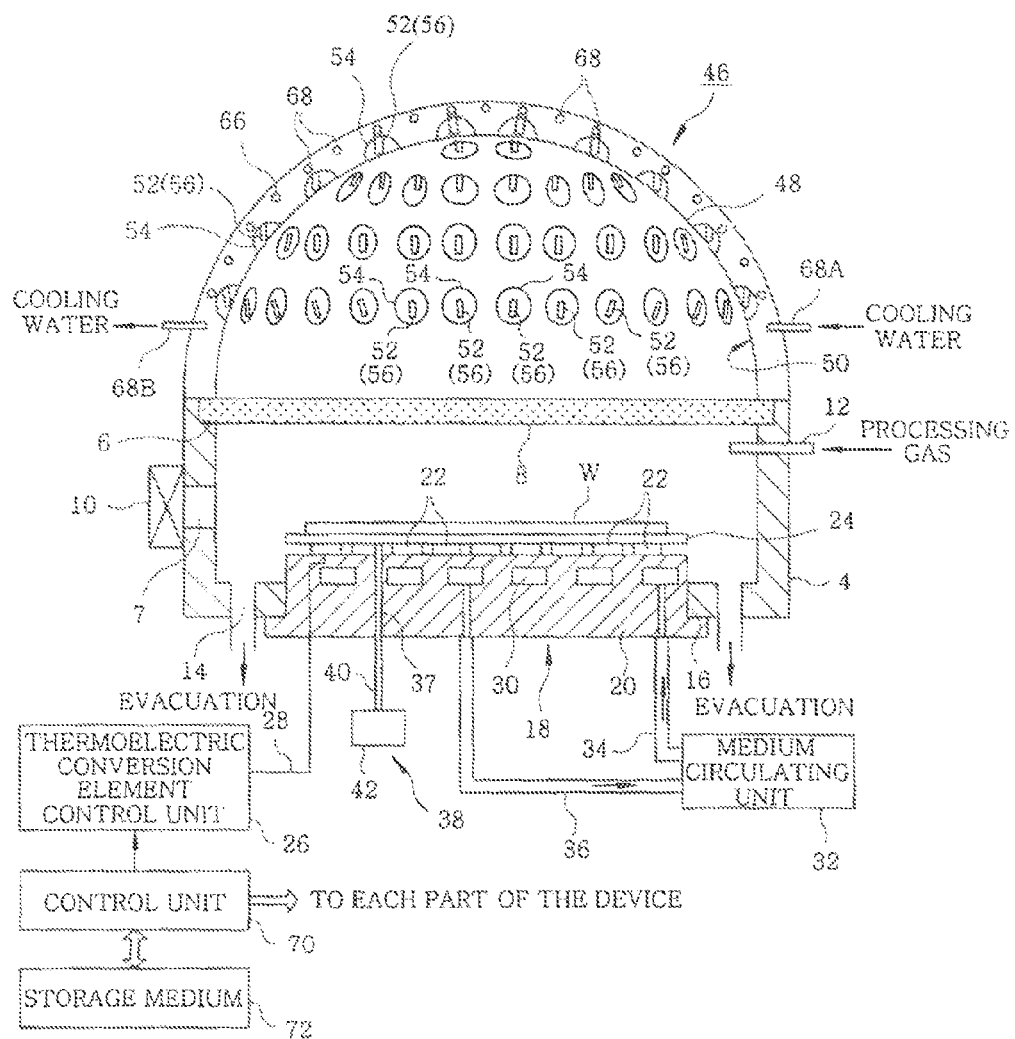
FIG. 1 provides a cross sectional view showing a heat treatment apparatus of a first preferred embodiment of the present invention.
Figure 2:
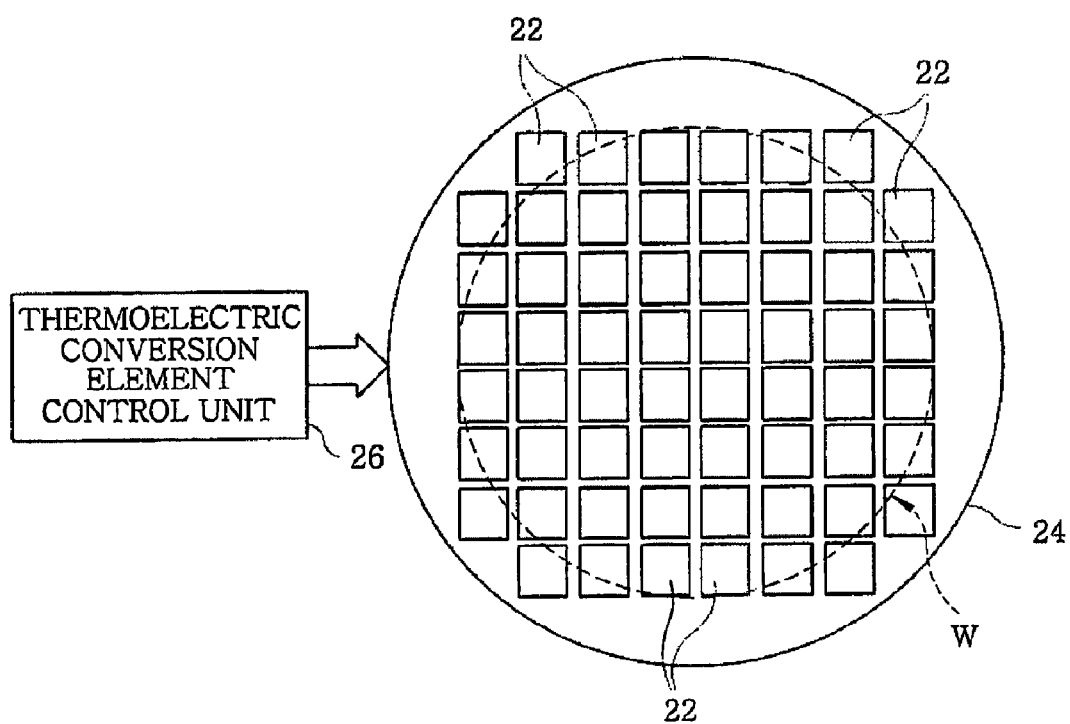
FIG. 2 shows a plan view showing an arrangement of thermoelectric conversion elements.
Figure 3:
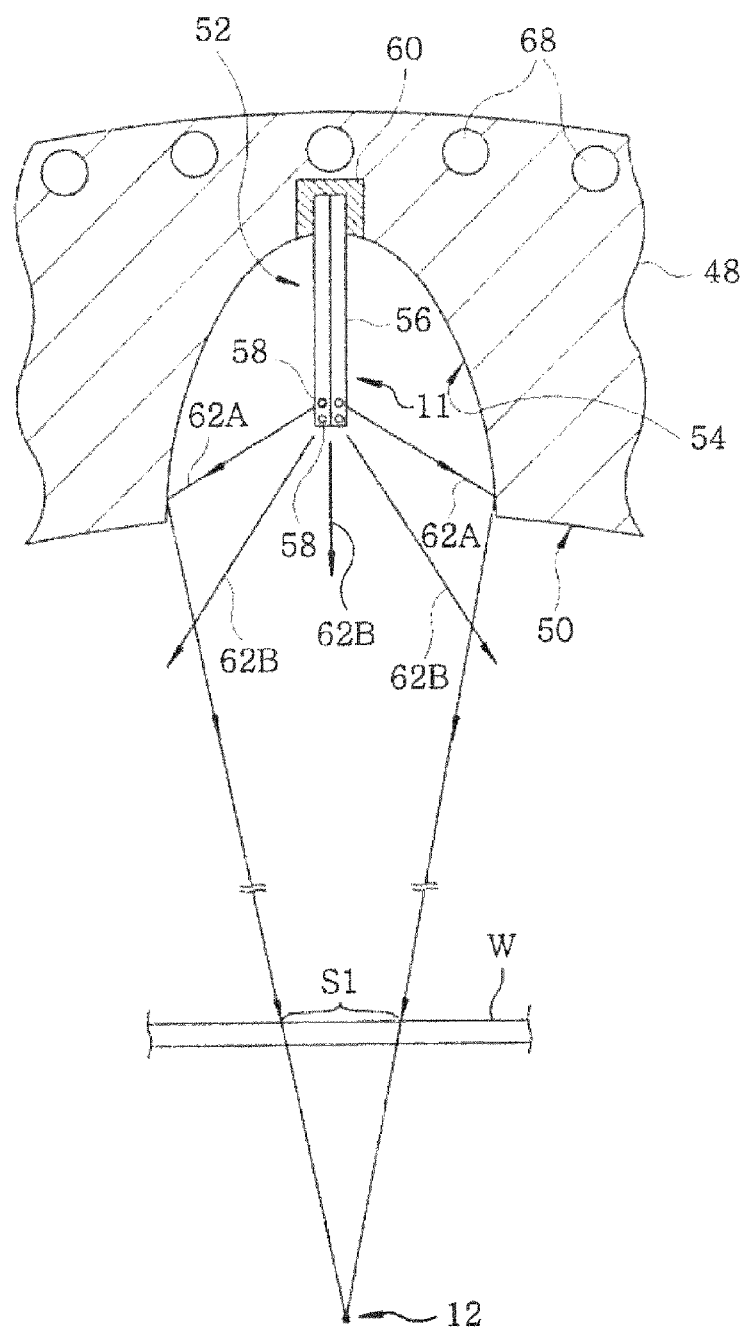
FIG. 3 illustrates a path of light for heating generated from a semiconductor light emitting element of a light source.
Figure 4:
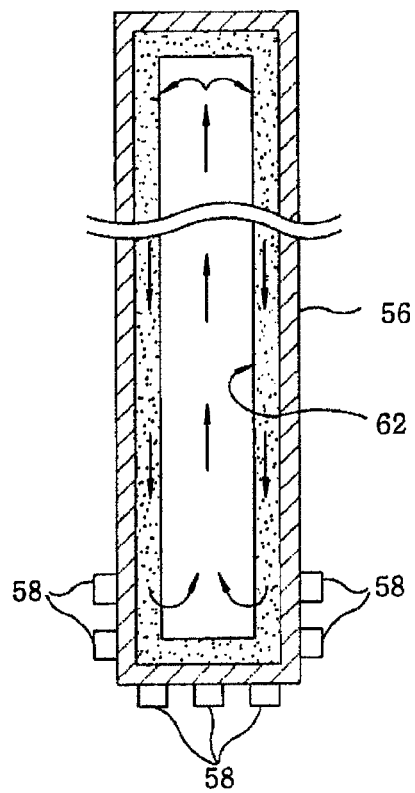
FIG. 4 is an enlarged cross sectional view showing an element attachment rod where the semiconductor light emitting element is attached.
Figure 5:
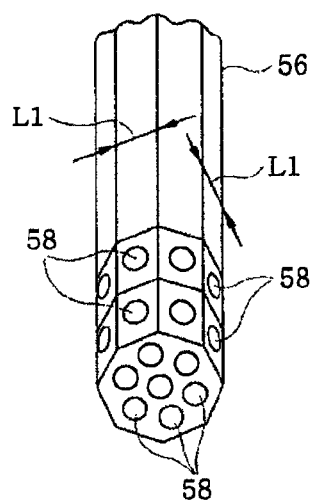
FIG. 5 is an enlarged perspective view showing an end portion of the element attachment rod.

FIG. 1 provides a cross sectional configuration view of a heat treatment apparatus of the first preferred embodiment of the present invention, FIG. 2 shows a plan view of an arrangement of a thermoelectric conversion element, FIG. 3 illustrates a path of light to be used for heating generated from a semiconductor light emitting element of a light source, FIG. 4 is an enlarged cross-sectional view representing an element attachment rod where the semiconductor light emitting element is attached, and FIG. 5 is an enlarged perspective view describing an end portion of the element attachment rod.

As shown in FIG. 1, a heat treatment apparatus 2 of the first preferred embodiment includes, for example, a processing chamber 4 of a housing shape made of aluminum. The processing chamber 4 is configured to accommodate a semiconductor wafer having a diameter of, e.g., 300 mm. A ceiling portion of the processing chamber 4 is opened, while airtightly installed in this opening through a sealing member 6 such as an O-ring or the like is a light transmitting window 8 for transmitting light for heating as will be described below. The light transmitting window 8 is made of, e.g., quartz.

Further, an opening 7 is provided in a sidewall of the processing chamber 4, and disposed on the opening 7 is a gate valve 10 to be opened and closed when a semiconductor wafer W is loaded or unloaded. Further, provided in another sidewall of the processing chamber 4 is a gas introducing means 12 serving as a gas introduction unit for introducing a processing gas therein when necessary. Formed in the vicinity of the bottom portion of the processing chamber 4 is a gas exhaust port 14, to which a gas exhaust system having a vacuum pump (not shown) is connected, whereby an atmosphere in the processing chamber 4 can be vacuum-exhausted. Furthermore, the processing chamber 4 can be maintained at atmospheric pressure depending on the process. In addition, the bottom portion of the processing chamber 4 is opened widely, and a thick mounting table 18 serving as a bottom portion as well is airtightly attached to the opening by interposing a sealing member 16 such as an O-ring or the like therebetween.

The mounting table 18 includes a thick mounting table main body 20 made of aluminum, a plurality of thermoelectric conversion elements 22 disposed on an upper portion of the mounting table main body 20 and a thin mounting plate 24 of a circular plate shape installed on a top surface of the thermoelectric conversion elements 22, wherein the semiconductor wafer W serving as the target object is directly mounted on the mounting plate 24. To be more specific, for example, a peltier element can be used as the thermoelectric conversion element 22. The peltier element refers to an element where, when different kinds of conductors or semiconductors are connected in series by an electrode and an electric current flows therethrough, generation or absorption of heat other than Joule heat occurs at the contact. For example, the peltier element is formed of Bismuth Telluride ($Bi_2Te_3$) having a temperature resistance up to 200° C., lead telluride (PbTe) or silicon germanium (SiGe) having a higher temperature resistance, or the like. The thermoelectric conversion element 22 is electrically connected to a thermoelectric conversion element control unit 26 via a lead wire 28. The thermoelectric conversion element control unit 26 controls the direction and the amount of the electric current supplied to the thermoelectric conversion element when heat treating the wafer W.

FIG. 2 shows an example of the arrangement of the thermoelectric conversion element 22 formed of the peltier element. In FIG. 2, for the wafer W having a diameter of 300 mm, sixty thermoelectric conversion elements 22 cover substantially entire rear surface of the mounting plate 24. By arranging the thermoelectric conversion elements 22 close to each other in this manner, the wafer W and the mounting plate 24 can be uniformly heated. The shape of the thermoelectric conversion element 22 is not limited to a square shape, and it may be a circular or a hexagonal shape. Herein, the thermoelectric conversion refers to converting thermal energy into electric energy or vice versa.

A heat transfer medium path 30 is formed inside the mounting table main body 20 over the almost entire surface in a planar direction thereof. The heat transfer medium path 30 is installed below the thermoelectric conversion elements 22. While the wafer W is cooled, the bottom surface of the thermoelectric conversion elements 22 is cooled by supplying a coolant (water) serving as a heat transfer medium. Furthermore, while the wafer W is heated, if necessary, the bottom surface of the thermoelectric conversion elements 22 is heated by supplying a heating medium. Further, the heat transfer medium path 30 is connected to a medium circulating unit 32 supplying a heat transfer medium via a heat transfer medium inlet line 34 and a heat transfer medium discharge line 36. Thereby, the medium circulating unit 32 circulates the heat transfer medium in the heat transfer medium path 30.

Further, the mounting plate 24 installed on the thermoelectric conversion elements 22 is made of a $SiO_2$ based material, an AlN based material, a SiC based material or the like which easily absorbs light from a heating light source 52 to be described below. If the heating light source 52 mainly emits ultraviolet light, the mounting plate 24 is made of a Ge based material, a Si based material, a metal or the like which easily absorbs ultraviolet light. The mounting table 18 is provided with an elevating mechanism (not shown) for vertically moving the wafer W, which includes a plurality of freely elevatable supporting pins for supporting the wafer W from its bottom surface penetrating through the mounting table main body 20 and the mounting plate 24 and a driving unit for vertically moving the supporting pins.

Moreover, formed at the mounting table main body 20 is a through hole 37 vertically penetrating therethrough, where a radiation thermometer 38 is installed. More specifically, an optical fiber 40 is airtightly inserted into the through hole 37 to guide radiant light from the mounting plate 24, wherein the optical fiber 40 is extended to the bottom surface of the mounting plate 24. Further, a radiation thermometer main body 42 is connected to the other end portion of the optical fiber 40 such that a temperature of the mounting plate 24, i.e. a temperature of the wafer, can be measured by using light in a specific measurement wavelength band. As will be described later, the measurement wavelength band of the radiation thermometer 38 is set different from that of light emitted by the semiconductor light emitting element.

Further, a heating unit 46 which irradiates light for heating toward the wafer W through the light transmitting window 8 is installed above the light transmitting window 8 of the processing chamber 4. To be specific, the heating unit 46 includes a dome-shaped element attachment housing 48 to cover a top portion of the light transmitting window 8. The dome-shaped element attachment housing 48 is formed of a material having high thermal conductivity such as aluminum, copper or the like and of, e.g., a hemispheric shape as a whole. Since a part of the lower portion of the element attachment housing 48 and a part of the upper portion of the processing chamber 4 are attached to each other through a hinge (not shown), the element attachment housing 48 can be hingedly opened.

An inner surface of the element attachment housing 48 is a reflective surface having high reflectivity, e.g., plated with gold and serves as a second reflector 50. Further, installed at the inner peripheral surface of the element attachment housing 48 is a plurality of heating sources 52, from which light for heating is emitted. The heating sources 52 are relatively uniformly distributed over the entire inner peripheral surface of the dome-shaped element attachment housing 48, and for example, approximately one hundred heating sources 52 are installed in this embodiment. Furthermore, as shown in FIG. 3, each heating source 52 is provided with a first reflector 54 of a recessed and curved shape. The inner peripheral surface of the first reflector 54 is also, e.g., a reflective surface coated with gold having a high reflectivity. The first reflector 54 has a circular opening. As described above, by forming the element attachment housing 48 in a curved dome shape, more heating sources 52 can be attached thereto than the case of a plane shape, whereby high power for heating can be supplied as much.

As shown in FIGS. 4 and 5, each heating source 52 includes a minute element attachment rod 56 of a bar shape and a plurality of semiconductor light emitting elements 58 attached to a leading end portion of the element attachment rod 56. By electrically connecting and fixing a base portion of the element attachment rod 56 to a connection terminal 60 formed at a central portion of the first reflector 54 of the element attachment housing 48, not only the element attachment rod 56 is supported, but also necessary power can be supplied to the semiconductor light emitting elements 58. Further, the connection terminal 60 is connected to a power supply system through a wire (not shown). Most element attachment rods 56 are formed in a substantially vertical direction.

Furthermore, the element attachment rod 56 is, e.g., a sealed hollow heat pipe, where a wick 62 is attached to inner sides thereof and a working fluid is provided therein as shown in FIG. 4. The element attachment rod 56 is made of a high thermoconductive metal such as aluminum and copper. The element attachment rod 56, of a polygonal cylindrical shape, e.g., an octagonal cylindrical shape shown in FIG. 5, has the semiconductor light emitting elements 58 concentrated at a leading end surface and sidewalls of the leading end portion thereof, and its overall size is so small as to be regarded as a point light source. Herein, the semiconductor light emitting element 58 is formed of an LED or semiconductor laser device having a size ranging from 0.3 to 1 mm square, and further there has been already developed a method capable of obtaining a high output by using one device based on the current technology. For example, an LED device generating a high output of 30 W and a semiconductor laser device generating a high output of 2.5 kW per $cm^2$ has already been developed.

Therefore, in case of the LED element, if there are thirty semiconductor light emitting elements 58 attached to one element attachment rod 56, one heating source 52 can generate a high output of 900 W (30 W×30). Further, by assuming that there are one hundred heating sources 52, the total power output becomes 90 kW (900 W×100). The element attachment rod 56 is provided with wires (not shown) which electrically connect the connection terminal 60 to each semiconductor light emitting element 58.

Herein, a total length of the element attachment rod 56 ranges from 20 mm to 50 mm, LED elements having a size ranging from 0.3 to 1 mm square serving as the semiconductor light emitting element 58 are attached to the element attachment rod 56, and a side length L1 of the octagon is about 1 mm, which indicates the miniaturization thereof.

Further, the light (thermal radiation) emitted from the semiconductor light emitting element 58 has a wavelength of 1.17 μm or less and is preferably an infrared ray having a wavelength of, e.g., 1 μm. The reason why the semiconductor light emitting element 58 emitting the light with a wavelength of 1.17 μm or less is used is because if the wafer W is a silicon substrate, thermal radiation absorption rate of the silicon substrate depends on the wavelength of the thermal radiation and the temperature of the wafer itself. To be more specific, the thermal radiation with a wavelength of 1.17 μm or less has high absorption rate ranging from 0.5 to 0.7 regardless of the temperature of the silicon substrate, whereas if the wavelength is greater than 1.17 μm, the absorption rate highly depends on the temperature of the silicon substrate. That is, as the temperature of the silicon substrate decreases, the absorption rate decreases while the transmittance increases. For example, if the temperature of the silicon substrate varies from 270° C. to 600° C., the absorption rate thereof varies from 0.1 to 0.7. Accordingly, in order to rapidly raise the temperature of the wafer W of the silicon substrate, it is preferable to use the semiconductor light emitting element 58 which emits thermal radiations having a wavelength of 1.17 μm or less. Herein, the thermal radiation refers to a broad range of light rays including an ultraviolet ray and an infrared ray as described above.

In such a case, the measurement wavelength band of the above-mentioned radiation thermometer 38 is set different from that of the light emitted by the semiconductor light emitting element 58 to prevent stray light from causing the measurement error, and is set to, e.g., 3 μm, which is greater than 1.17 μm as the measurement wavelength band.

Further, as shown in FIG. 3, by assuming that a curved surface of the first reflector 54 is a rotated elliptical surface (spheroid shape) with two focal points f1 and f2, and by disposing the semiconductor light emitting elements 58 of the heating source 52 regarded as a point light source at the focal point f1, reflected light 62A reflected by the first reflector 54 among the light emitted from the heating source 52 is focused on the second focal point f2. However, since each of the semiconductor light emitting elements 58 is actually not an ideal point light source, a part of the reflected light 62A which is emitted from the heating source 52 and reflected by the first reflector 54 is not focused on the second focal point f2, but diffused, thereby irradiating to its periphery. Further, a part of direct light 62B which is emitted from the heating source 52 but does not reach the first reflector 54 is directly irradiated onto the surface of the wafer W, while the other part is reflected by the second reflector 50 and irradiated onto the surface of the wafer W. Among the light irradiated to the wafer W, the amount of the light absorbed by the wafer W is maximum 70%, and the rest of it is reflected or transmitted. However, the reflected light is again reflected by the second reflector 50 and irradiated to the wafer W. Further, the light irradiated on the side or bottom surface of the mounting table 18 and the processing chamber 4 among the direct light is lost. The amount of light loss can be greatly reduced by adjusting a size, an inclination, an opening diameter or the like of the first reflector 54.

The number of the heating sources 52 is determined by a size of the wafer W, an area S1 of the wafer W irradiated by a single heating source 52, a design criteria of a temperature increase rate of the wafer W, a total power of the heating sources 52, a diameter of the second reflector 50 or the like. Here, by arranging heating sources 52 such that each heating source 52 irradiates on a different irradiation area S1 on the surface of the wafer W, the entire surface area of the wafer W can be irradiated.

Referring to FIG. 1, installed at the element attachment housing 48 provided with the heating sources 52 is an element cooling unit 66 for cooling a base portion of each element attachment rod 56. To be more specific, the element cooling unit 66 has coolant passageways 68 passing through the vicinity of the base portion of the element attachment rod 56, and cooling water serving as a cooling medium is introduced through a coolant inlet 68A and discharged through a coolant outlet 68B. Further, an inner space of the element attachment housing 48 can be air-cooled. Furthermore, the entire heat treatment apparatus 2 is controlled by a control unit 70 including, e.g., a microcomputer or the like. The control unit 70 is provided with a storage medium 72 such as a floppy disc, a flash memory or the like to store a computer program for controlling the operation of the entire apparatus.

Hereinafter, a heat treatment operation performed on the wafer W by using the heat treatment apparatus 2 as configured above will be now described. As described above, the following operation is carried out by employing the program stored in the storage medium 72. As an example, there will now be described the case of annealing a wafer W whose surface is implanted with impurities.

First, after the gate valve 10 formed on a sidewall of the processing chamber 4 is opened, the wafer W to be processed is loaded into the processing chamber 4 through the opening 7 and then mounted on the mounting plate 24 of the mounting table 18. Subsequently, the gate valve 10 is closed to seal the processing chamber 4. Next, the processing chamber 4 is vacuum-evacuated by the vacuum exhaust system, and supplied with a processing gas such as an argon gas or a nitrogen gas from a gas supply source, whereby the processing chamber 4 is maintained at a specified processing pressure, e.g., ranging from 100 Pa to 10000 Pa.

Next, an electric current is applied to the thermoelectric conversion element 22 having the peltier element, whereby the wafer W is preliminarily heated. The wafer W is preliminarily heated at a temperature ranging from 500° C. to 600° C., where the impurities implanted in the wafer W do not diffuse.

The temperature of the wafer W is detected by the radiation thermometer 38. If the radiation thermometer 38 detects that the wafer W reaches a predetermined preliminary heating temperature, all of the heating sources 52 of the heating unit 46 are turned on so that light is emitted from each semiconductor light emitting element 58, and whereby thermal radiations are irradiated to the surface of the wafer W. Therefore, the temperature of the surface of the wafer W is instantaneously raised to a predetermined processing temperature, e.g., 1000° C. At this time, the electric power, e.g., full electric power, is supplied to the thermoelectric conversion elements 22 to quickly raise the temperature of the wafer W. Further, by way of maintaining the high temperature state for a predetermined time, the annealing process is performed. In this manner, by heating the wafer W from its upper and lower side, the temperature elevation speed of the wafer W can range from, e.g., 100° C./sec to 300° C./sec to thereby realize high-speed temperature elevation.

Especially, by installing numerous heating sources 52 each of which has the plurality of semiconductor light emitting elements 58 capable of producing a high output, light for heating (thermal radiation) with a high output can be generated from each heating source 52. Therefore, illumination intensity of the thermal radiation on the surface of the wafer can be very high, thereby making it possible to rapidly raise the temperature. Further, in case of elevating the temperature of the wafer, the thermoelectric conversion elements 22 function as a lower heating unit.

In this annealing process, a rear surface of the thermoelectric conversion element 22 having the peltier element is cooled. In order to avoid such cooling, it is desirable to flow a heating medium through the heat transfer medium path 30 disposed in the mounting table main body 20 and thereby efficiently operate the thermoelectric conversion element 22.

Further, although the semiconductor light emitting element 58 of the heating unit 46 has good light emission efficiency, some heat generation thereof is inevitable. However, since the element attachment rod 56 to which the semiconductor light emitting element 58 is attached includes a heat pipe, heat generated from the semiconductor light emitting element 58 is transferred to the element attachment housing 48 made of aluminum or the like through the other end portion of the element attachment rod 56. Further, cooling water flows through the coolant passageway 68 of the element cooling unit 66 disposed in the element attachment housing 48, thereby dissipating the heat. As a result, the semiconductor light emitting element 58 and the element attachment rod 56 can be efficiently cooled.

Furthermore, since most of the element attachment rods 56, each including a heat pipe, are disposed in a vertical or near vertical direction, the heat pipe which is operated by using gravitational force can be efficiently operated, and cooling efficiency of the semiconductor light emitting elements 58 can be increased as much.

Besides, the light emitted from the semiconductor light emitting element 58 with high light emission efficiency is efficiently and uniformly irradiated on the surface of the wafer through the first and second reflectors 54 and 50, thereby improving the heating efficiency and temperature uniformity of the wafer surface.

After the annealing process is carried out for a predetermined short time in this manner, the wafer W is cooled as quickly as possible in order to prevent the impurities in the wafer W from excessively diffusing. That is, in this case, to lower the temperature of the wafer at high speed, an electric current flows through the thermoelectric conversion element 22 including the peltier element in an opposite direction to the heating mode to cool the top surface thereof. Thereby, the mounting plate 24 is cooled to rapidly cool the wafer W. At this time, the bottom surface of the thermoelectric conversion element 22 is heated from thermal energy generated therefrom. However, by flowing a cooling medium through the heat transfer medium path 30 in contrast to the wafer heating mode, this can be cooled down. Accordingly, the thermoelectric conversion element 22 can be efficiently operated.

Further, at the same time as the above operation, each heating source 52 of the heating unit 46 installed at the element attachment housing 48 is turned off, and power being supplied thereto is cut off. At the same time, a coolant such as cooling water continuously flows through the coolant passageway 68 of the element cooling unit 66 to cool the element attachment rod 56 and the semiconductor light emitting element 58 of each heating source 52. Here, in case of using a heating lamp to heat the wafer, the wafer is heated up by radiant heat emitted from the heating lamp itself, since the heating lamp has high heat capacity and remains at a high temperature after being turned off. Therefore, there is a limit to increasing the temperature lowering speed even when using a cooling unit. However, in accordance with the apparatus of the present invention, by using the semiconductor light emitting element 58 including the LED or semiconductor laser device having a low heat generation rate, and cooling the element 58 and the element attachment rod 56 by using the element cooling unit 66, the heat dissipation rate of the element itself can be controlled and the elements can be cooled quickly. Accordingly, the generated radiant heat can be greatly reduced to improve the temperature lowering speed of the wafer W, thereby realizing a high-speed temperature reduction.

As described in the case of heating the wafer, since the element attachment rods 56 includes a heat pipe and many of them are disposed in a vertical or near vertical direction for the efficient operation of the heat pipe, the semiconductor light emitting elements 58 can be effectively and efficiently cooled to thereby realize higher-speed temperature reduction. In accordance with the apparatus of the present invention, the temperature lowering speed of the wafer can range from, e.g., 100° C./sec to 300° C./sec. Further, the lifetime of the semiconductor light emitting element 58 is longer than that of the heating lamp.

Further, although the above preferred embodiment has been described that the curved surface of the first reflector 54 is the rotated elliptical surface disposed at each corresponding heating source 52, the present invention is not limited thereto and a curved surface approximated to the rotated elliptical surface such as a rotated parabolic surface (circular paraboloid shape), a hemispheric surface or the like may be employed.

Furthermore, each heating source 52 provided at the element attachment housing 48 may be, e.g., concentrically partitioned into a plurality of regions whose power supply is individually controlled.

Meanwhile, the gas introducing means 12 serving as a gas inlet unit is not limited thereto, and a shower head structure made of a material transparent to the light for heating such as quartz can be used.

Further, though the element attachment housing 48 of a hemispheric shape (dome shape) has been exemplified in the above preferred embodiment, it is not limited thereto, and may have the rotated elliptical shape, or a curved shape approximated to the rotated elliptical shape. Moreover, it may have a planar shape, although the number of the heating source 52 attached to the element attachment housing 48 decreases. After all, it is designed based on the output power of each heating source 52, the heating temperature of the wafer W or the like.

Second Preferred Embodiment

Hereinafter, the second preferred embodiment of the heat treatment apparatus in accordance with the present invention will be described. While the above-described first preferred embodiment has been described with respect to the case of the element attachment housing 48 of a dome shape like a substantially hemispheric shape, the second preferred embodiment will be described in detail with respect to the case of a substantially flat element attachment housing 48.

Figure 6:
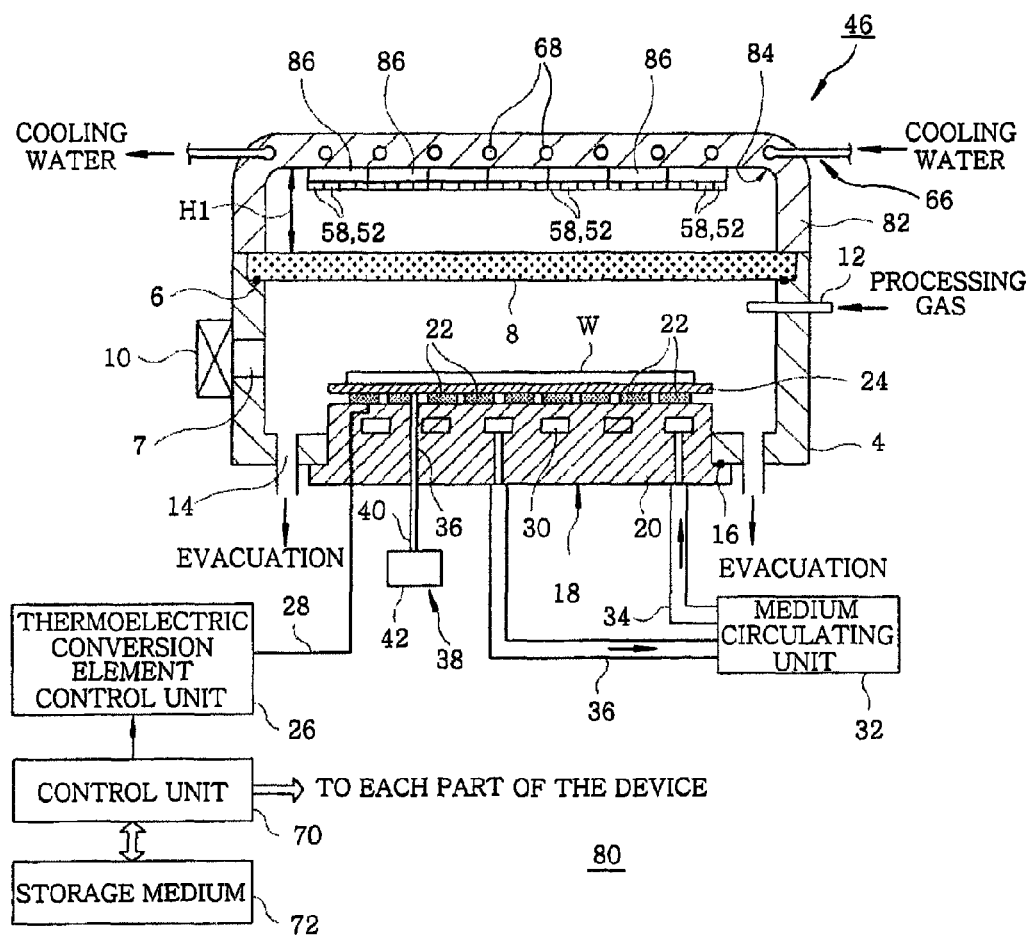
FIG. 6 is a cross sectional view showing a heat treatment apparatus in accordance with a second preferred embodiment of the present invention.
Figure 7:
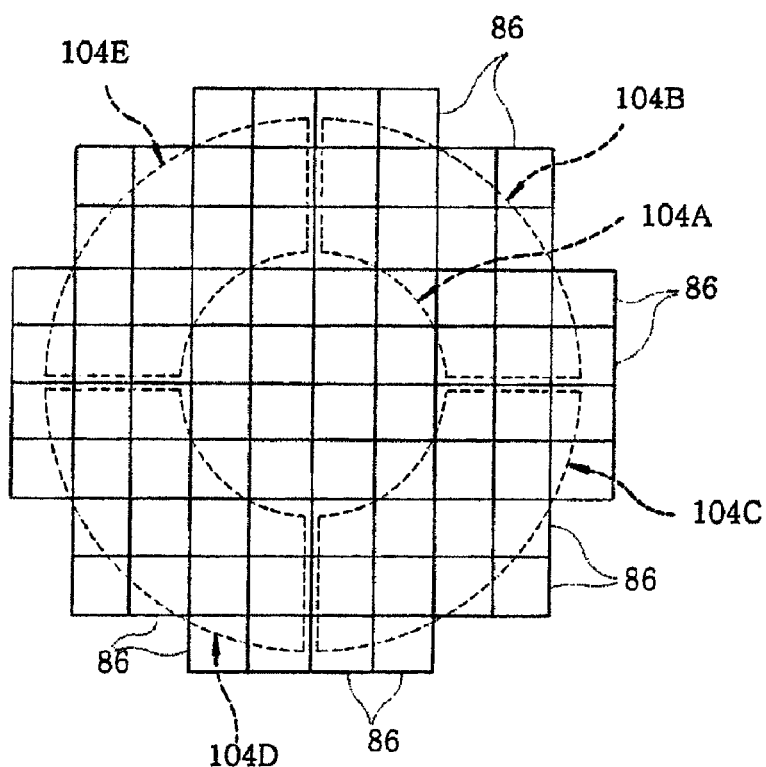
FIG. 7 is a plan view showing an arrangement of a specified number of semiconductor light emitting elements block-partitioned into a plurality of modules which are attached to an element installation substrate.
Figure 8:
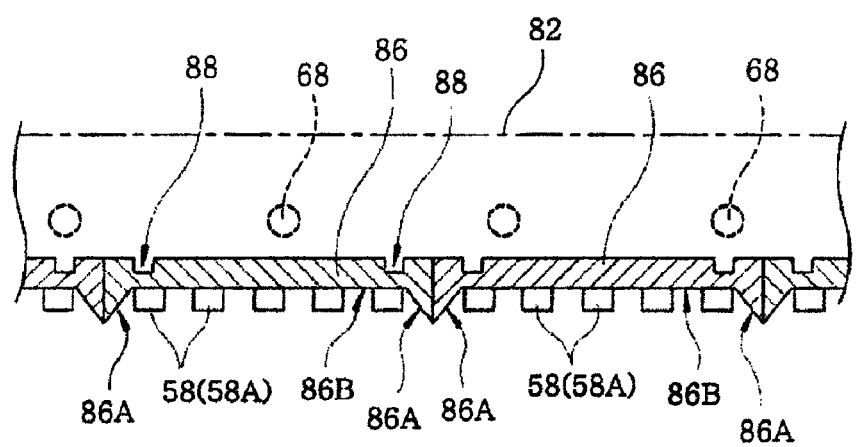
FIG. 8 illustrates an enlarged cross sectional view representing an arrangement of the elements on the element installation substrate.
Figure 9:
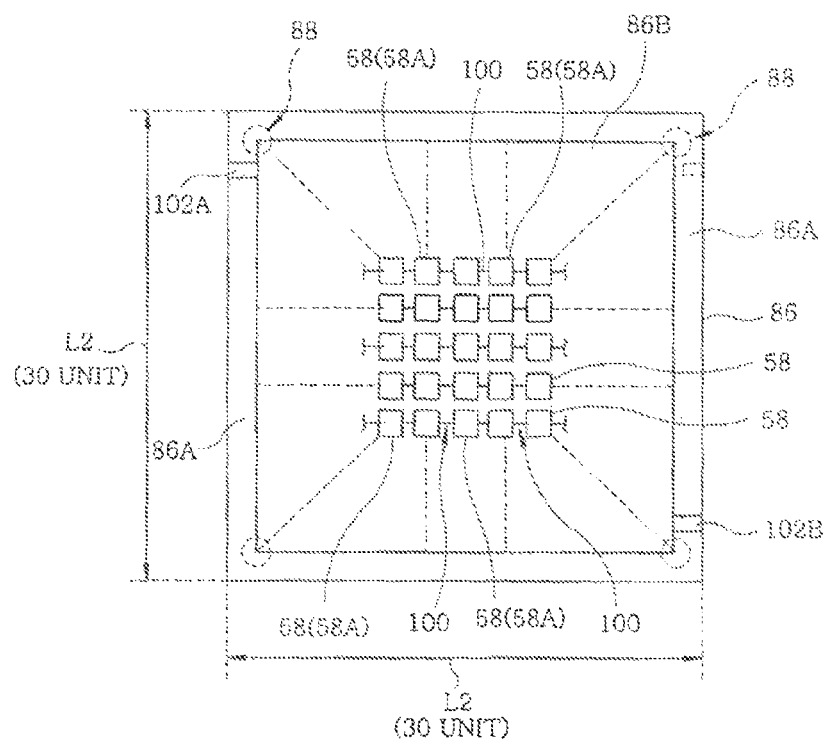
FIG. 9 is an enlarged plan view showing an example of the element installation substrate.
Figure 10:
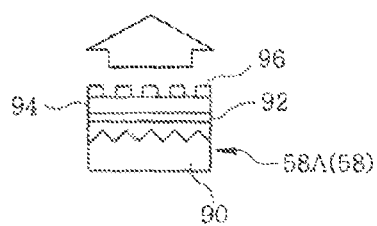
FIG. 10 is a schematic cross sectional view showing an example of an LED chip.

FIG. 6 provides a cross sectional view showing the heat treatment apparatus in accordance with the second preferred embodiment of the present invention, FIG. 7 shows a plan view showing an arrangement of a specified number of semiconductor light emitting elements block-partitioned into a plurality of modules on an element installation substrate, FIG. 8 illustrates an enlarged cross sectional view showing an arrangement of the element installation substrate, FIG. 9 is an enlarged plan view describing an example of the element installation substrate, and FIG. 10 is a schematic cross sectional view showing an example of an LED chip. Further, identical reference numerals will be used for the same parts described in FIGS. 1 to 5 and description thereof will be omitted.

As shown in FIG. 6, in a heat treatment apparatus 80 of the second preferred embodiment, an element attachment housing 82 of a heating unit 46 to cover a top portion of a light transmitting window 8 disposed at a ceiling portion of a processing chamber 4 does not have a dome shape but instead has a substantially planar shape, and peripheral portions thereof are bent vertically downwards. The element attachment housing 82 is made by cutting a high thermoconductive material such as aluminum. Coolant passageways 68 are formed over the entire surface of the element attachment housing 82 to form an element cooling unit 66.

Further, an inner surface, i.e. a bottom surface in the drawing, of the element attachment housing 82 is an element attachment surface 84 to face a mounting table 18. A distance H1 between the element attachment surface 84 and the light transmitting window 8 is set small, for example, from 10 to 20 mm, to improve the heating efficiency. A plurality of semiconductor light emitting elements 58 is formed over the substantially entire surface of the element attachment surface 84. The semiconductor light emitting elements 58 form a heating source 52.

More specifically, the plurality of semiconductor light emitting elements 58 are partitioned into blocks. That is, as shown in FIGS. 7 and 8, each module has one small element installation substrate 86, and each element installation substrate 86 is arranged horizontally without a substantial gap and attached to the flat element attachment surface 84. The area where the element installation substrates 86 are disposed is formed larger than the projected area of the wafer W mounted on the mounting table 18.

Further, as shown in FIG. 9, by attaching a specified number of the semiconductor light emitting elements 58 to the element installation substrate 86, the area where the semiconductor light emitting elements 58 are disposed is formed larger than the projected area of the wafer W mounted on the mounting table 18. The element installation substrate 86 is made of high thermoconductive material such as aluminum, and has a cross section of a recess shape as a whole since peripheral portions 86A thereof protrude downwards. In the drawing, the element installation substrate 86 is of a square shape, but is not limited thereto. Furthermore, formed at the four corners of a rear surface of the element installation substrate 86 (top surface in FIG. 8) is a closed spot face 88 for the location determination.

Meanwhile, the semiconductor light emitting elements 58 are regularly arranged in a lengthwise and widthwise direction with a very small interval from each other and attached to the element installation substrate 86. Herein, a length and width L2 of each element installation substrate 86 is 25 mm (see, FIG. 9) and each element installation substrate 86 has a thickness of 5 mm. Since 30×30 semiconductor light emitting elements 58 are arranged in lengthwise and widthwise directions, there are 900 semiconductor light emitting elements 58 in total. Further, there are arranged, for example, 148 modules, i.e. element installation substrates 86, on the entire element attachment housing 82. However, FIG. 7 shows a reduced number of the element installation substrates 86 for simplicity. That is, there are 133200 (900×148) semiconductor light emitting elements 58 disposed all over the element installation housing 82. Here, the number of the installed semiconductor light emitting elements 58 is not limited thereto, and may be determined based on the output of each element, the designed value of the temperature elevation speed of the wafer W or the like.

In such a case, as the semiconductor light emitting element 58, a packaged element formed of an LED chip or semiconductor laser chip packed by using a resin can be used, but it is preferable to use the LED chip or the semiconductor laser chip so that a mounting density can be improved. As well known, the packaged LED element or semiconductor laser element is made by cutting a group of elements formed on a semiconductor wafer into a chip, providing a lens to the chip, and then packing with a resin. However, in this embodiment, it is preferable to use the LED chip or semiconductor laser chip before packaging with the resin or the like.

Further, as the semiconductor light emitting element 58, a minute LED chip 58A before being packaged is used herein. Among LED chips, a surface-emitting type LED chip capable of surface-emitting light may be preferably used as the LED chip 58A due to a large light output amount thereof. Such a surface-emitting type LED chip 58A has a size ranging from, e.g., 0.3 to 1 mm square and can be mounted on the element installation substrate 86 with a high density. As shown in FIG. 10, the LED chip 58A includes an emitting region 92 formed on a sapphire substrate 90 having prominences and depressions, a nitride semiconductor layer 94 formed on the emitting region 92, and a mesh type electrode 96 on a surface of the nitride semiconductor layer 94.

As shown in FIG. 9, for example, 900 semiconductor light emitting elements 58 attached to one element installation substrate 86 are electrically connected in series through a wiring 100 in order to reduce the power supply equipment. Further, electrodes 102A and 102B electrically connected to outside are disposed in the peripheral portions of the element installation substrate 86.

Moreover, each of an inner surface 86B of the element installation substrate 86 (bottom surface in FIG. 8) and the element attachment surface 84 of the element attachment housing 82 (see, FIG. 6) is a reflective surface such as a mirror surface and serves as a reflector. Thereby, heating efficiency can be improved in case of heating the wafer.

The element installation substrates 86 formed in this way, i.e. the semiconductor light emitting elements 58, are partitioned into a plurality of regions as shown in FIG. 7, each of which is independently controlled. As shown in FIG. 7, there are a total of 5 zones, i.e. a central zone 104A and quartered zones 104B to 104E arranged in the peripheral portion. In FIG. 7, lines for dividing the zones are schematically indicated.

Further, the heat treatment apparatus 80 of the second preferred embodiment with the above configuration has basically the same operation as the above-described first preferred embodiment.

Particularly, since the element attachment housing 82 is not of a dome shape but instead is of a planar shape in this second preferred embodiment, a distance between each semiconductor light emitting element 58 and the wafer W is shorter than that of the first preferred embodiment, thereby improving the heating efficiency.

Moreover, as the semiconductor light emitting element 58 attached to each element installation substrate 86, the LED chip 58A, i.e., a chip cut off from the semiconductor wafer is used. Thereby, the LED chip 58A can be attached thereto with a high mounting density, and thus, the temperature elevation speed can be increased as much.

Meanwhile, since the element installation substrate 86 to which the semiconductor light emitting elements 58 are directly attached and the element attachment housing 82 are made of high thermoconductive material, heat generated from the semiconductor light emitting elements 58 can be efficiently transferred to outside by flowing cooling water through the coolant passageway 68 of the element cooling unit 66 disposed in the element attachment housing 82. Therefore, the semiconductor light emitting elements 58, the element installation substrate 86 and the element attachment housing 82 can be efficiently cooled to thereby realize higher-speed temperature reduction.

Further, for the attachment of the semiconductor light emitting elements 58, a specified number of the semiconductor light emitting elements 58 are attached to one element installation substrate 86 to form a module, and then the element installation substrate 86 is attached to the element attachment housing 82, which makes the mounting work simple.

Besides, because each semiconductor light emitting element 58 is arranged in parallel with the wafer surface, the wafer W can be uniformly heated over its surface and further optical and thermal design can be simplified.

Furthermore, the flat element attachment housing 82 makes the apparatus itself smaller.

Third Preferred Embodiment

Hereinafter, the third preferred embodiment of the heat treatment apparatus in accordance with the present invention will be described. Although the above-described first and second preferred embodiments have been described with respect to the case of the mounting table 18 provided with the thermoelectric conversion element 22 formed of the peltier element, the present invention is not limited thereto, and may use a common mounting table conventionally used.

Figure 11:
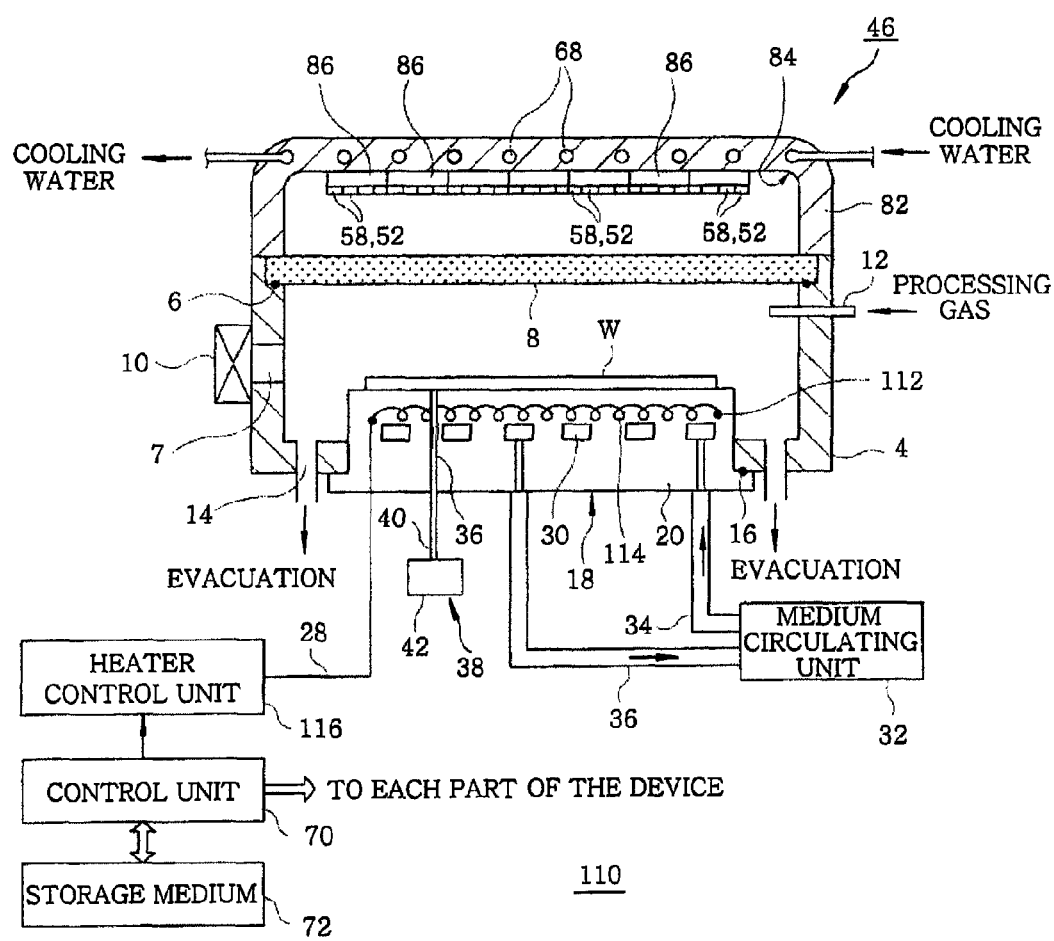
FIG. 11 provides a cross sectional view showing a heat treatment apparatus in accordance with a third preferred embodiment of the present invention.

FIG. 11 provides a cross sectional view showing the heat treatment apparatus in accordance with the third preferred embodiment of the present invention.

Herein, a heating unit 46 with the element attachment housing 82 of a planar shape of the second preferred embodiment shown in FIG. 6 disposed at the ceiling portion of a processing chamber is exemplified. Further, identical reference numerals will be used for the same parts described in FIGS. 1 to 10 and description thereof will be omitted.

As shown in FIG. 11, a heat treatment apparatus 110 of the third preferred embodiment includes, e.g., a resistance heater 114 installed instead of the above thermoelectric conversion element 22 at a mounting table 18, which serves as a lower heating unit 112. Further, the operation of the resistance heater 114 is controlled by a heater control unit 116.

In case of increasing the temperature of the wafer, the operation of the resistance heater 114 is the same as that of the above-described first and second preferred embodiments. First, an electric current is applied to the resistance heater 114, whereby the wafer W is preliminarily heated to a temperature ranging from 500° C. to 600° C. After that, by turning all heating sources 52 of the heating unit 46 on to emit light from each semiconductor light emitting element 58 and further heating the wafer W from its upper and lower sides, a temperature of the wafer W is instantaneously raised to a predetermined processing temperature (e.g., 1000° C.). Here, in case of lowering the temperature of the wafer W by using the thermoelectric conversion element 22 as described above, the wafer can be forcibly cooled by flowing an electric current in an opposite direction to the heating mode. However, in this embodiment, since only the electric current applied to the resistance heater 114 is stopped in order to lower the temperature of the wafer W, the temperature lowering speed is a little slower than those of the first and second preferred embodiments. However, still in this embodiment, in case of lowering the temperature of the wafer, the mounting table 18 is cooled to accelerate the cooling of the wafer W by flowing a cooling medium through a heat transfer medium path 30.

Furthermore, although this embodiment has been described for the case of employing the resistance heater 114 as the lower heating unit 112, it is not limited thereto, and may use a heating lamp. In case of using the heating lamp, the mounting table 18 is formed of a thin plate shape and thermal radiations of the heating lamp are irradiated from its lower side.

Moreover, while the LED chip 58A or the semiconductor laser chip, which is a minute piece cut off from the wafer, has been exemplified as the semiconductor light emitting element 58 in the second preferred embodiment, the first preferred embodiment may use the LED or semiconductor laser chip in a minute piece shape as well as a device formed of a chip packed with a resin.

Herein, the annealing process has been exemplified as the heat treatment process, but the present invention is not limited thereto, and may be applied to various heat treatment processes such as an oxidation/diffusion process, a film forming process, a reforming process, an etching process or the like.

Further, the LED and semiconductor laser devices can be used together for the semiconductor light emitting elements 58.

Furthermore, although the above preferred embodiments have been described with respect to the semiconductor wafer as the target object, the present invention is not limited thereto and may be applied to a glass substrate, an LCD substrate, a ceramic substrate or the like. In this case, a semiconductor light emitting element outputting a wavelength having the highest light absorptance for each substrate type is selected.

What is claimed is:

1. A heat treatment apparatus for performing a specified heat treatment on a target object, comprising:
    an evacuable processing chamber;
    a mounting table on which the target object is mounted, the mounting table being disposed in the processing chamber;
    a lower heating unit for heating the target object, the lower heating unit being disposed in the mounting table or below the mounting table;
    a light transmitting window for airtightly covering a ceiling portion of the processing chamber;
    a gas introduction unit for introducing a required gas into the processing chamber; and
    a heating unit for emitting light for heating to the target object through the light transmitting window, the heating unit being disposed above the light transmitting window and having a plurality of heating sources each of which includes a semiconductor light emitting element,
    wherein each of the heating sources includes an element attachment rod having a heat pipe, and each of the semiconductor light emitting elements is attached to an end portion of the corresponding element attachment rod, and
    wherein the heating unit includes an element attachment housing to cover a top portion of the light transmitting window, and a base portion of each of the element attachment rod is supported by the element attachment housing.

2. The heat treatment apparatus of claim 1, wherein first reflectors are disposed in a vicinity of the heating sources, respectively, the first reflectors serving to reflect light from their respective heating source to the target object.

3. The heat treatment apparatus of claim 2, wherein the light reflected by each of the first reflectors is focused on corresponding area of the target object.

4. The heat treatment apparatus of claim 2, wherein a reflective surface of the first reflectors is of a curved shape.

5. The heat treatment apparatus of claim 1, wherein the element attachment housing is of a dome shape, and an inner surface of the element attachment housing has a curved reflective surface serving as a second reflector.

6. The heat treatment apparatus of claim 1, wherein the element attachment housing is provided with an element cooling unit for cooling the base portion of the element attachment rods.

7. The heat treatment apparatus of claim 1, wherein each of the element attachment rods is extended in a vertical or near vertical direction.

8. The heat treatment apparatus of claim 1, further comprising a radiation thermometer for measuring a temperature of the target object, wherein a measurement wavelength band of the radiation thermometer is set different from that of the light emitted from the semiconductor light emitting elements.

9. The heat treatment apparatus of claim 1, wherein the semiconductor light emitting elements are formed of an LED or semiconductor laser device.

10. The heat treatment apparatus of claim 1, wherein the lower heating unit includes a resistance heater or a heating lamp or a plurality of thermoelectric conversion elements disposed in an upper portion of the mounting table.

11. The heat treatment apparatus of claim 10, wherein a heat transfer medium path is formed in a vicinity of the thermoelectric conversion elements for flowing a heat transfer medium therethrough when necessary.

12. The heat treatment apparatus of claim 10, further comprising a control unit for controlling an operation of an entirety of the heat treatment apparatus, wherein, in case of heating the target object, the control unit turns the heating unit on and allows an electric current to flow to the thermoelectric conversion elements through a thermoelectric conversion element control unit to heat the target object, and, in case of cooling the target object, the control unit turns the heating unit off and allows an electric current to flow to the thermoelectric conversion elements through the thermoelectric conversion element control unit to cool the target object.

13. The heat treatment apparatus of claim 1, further comprising a control unit for controlling an operation of an entirety of the heat treatment apparatus, wherein, in case of heating the target object, the control unit turns the lower heating unit on to heat the target object to a predetermined preliminary heating temperature and then turns the heating unit on to raise the temperature of the target object to a predetermined processing temperature.

14. A heat treatment apparatus for performing a specified heat treatment on a target object, comprising:
    an evacuable processing chamber;
    a mounting table on which the target object is mounted, the mounting table being disposed in the processing chamber;
    a lower heating unit for heating the target object, the lower heating unit being disposed in the mounting table or below the mounting table;
    a light transmitting window for airtightly covering a ceiling portion of the processing chamber;
    a gas introduction unit for introducing a required gas into the processing chamber; and
    a heating unit for emitting light for heating to the target object through the light transmitting window, the heating unit being disposed above the light transmitting window and having a plurality of heating sources each of which includes a semiconductor light emitting element,
    wherein the heating unit includes an element attachment housing to cover a top portion of the light transmitting window, and a lower surface of the element attachment housing is a flat element attachment surface facing the mounting table, the semiconductor light emitting elements of the heating sources are provided at the element attachment surface.

15. The heat treatment apparatus of claim 14, wherein an area of the element attachment surface where the semiconductor light emitting elements are disposed is formed larger than a projected area of the target object mounted on the mounting table.

16. The heat treatment apparatus of claim 14, wherein a specified number of the semiconductor light emitting elements are attached to an element installation substrate, and the element installation substrate and the semiconductor light emitting elements attached thereto form a block module.

17. The heat treatment apparatus of claim 16, wherein each element installation substrate is made of high thermoconductive material and has a cross section of a recess shape.

18. The heat treatment apparatus of claim 16, wherein the specified number of the semiconductor light emitting elements attached to the element installation substrate of each module are electrically connected in series.

19. The heat treatment apparatus of claim 17, wherein either one or both of the element attachment surface of the element attachment housing and a surface of the element installation substrate are reflective surfaces functioning as reflectors, respectively.

20. The heat treatment apparatus of claim 14, wherein each of the semiconductor light emitting elements includes an LED or semiconductor laser device.

21. The heat treatment apparatus of claim 14, wherein each of the semiconductor light emitting elements includes an LED or semiconductor laser chip.

22. The heat treatment apparatus of claim 14, wherein each of the semiconductor light emitting elements is a surface-emitting device.

23. The heat treatment apparatus of claim 14, wherein the semiconductor light emitting elements are partitioned into a plurality of zones, each of which is independently controlled.

24. The heat treatment apparatus of claim 14, wherein the lower heating unit includes a resistance heater or a heating lamp or a plurality of thermoelectric conversion elements disposed in an upper portion of the mounting table.

25. The heat treatment apparatus of claim 14, further comprising a control unit for controlling an operation of an entirety of the heat treatment apparatus, wherein, in case of heating the target object, the control unit turns the lower heating unit on to heat the target object to a predetermined preliminary heating temperature and then turns the heating unit on to raise the temperature of the target object to a predetermined processing temperature.

26. The heat treatment apparatus of claim 24, wherein a heat transfer medium path is formed in a vicinity of the thermoelectric conversion elements for flowing a heat transfer medium therethrough when necessary.

27. The heat treatment apparatus of claim 24, further comprising a control unit for controlling an operation of an entirety of the heat treatment apparatus, wherein, in case of heating the target object, the control unit turns the heating unit on and allows an electric current to flow to the thermoelectric conversion elements through a thermoelectric conversion element control unit to heat the target object, and, in case of cooling the target object, the control unit turns the heating unit off and allows an electric current to flow to the thermoelectric conversion elements through the thermoelectric conversion element control unit to cool the target object.

* * * * *